United States Patent
Tran et al.

(10) Patent No.: US 6,597,598 B1
(45) Date of Patent: Jul. 22, 2003

(54) RESISTIVE CROSS POINT MEMORY ARRAYS HAVING A CHARGE INJECTION DIFFERENTIAL SENSE AMPLIFIER

(75) Inventors: Lung T. Tran, Saratoga, CA (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/136,782

(22) Filed: Apr. 30, 2002

(51) Int. Cl.[7] .............................................. G11C 17/00
(52) U.S. Cl. ............................. 365/94; 365/97; 365/100
(58) Field of Search ............................ 365/94, 97, 100, 365/158

(56) References Cited

U.S. PATENT DOCUMENTS

| | | | |
|---|---|---|---|
| 5,793,697 A | 8/1998 | Scheuerlein | 365/171 |
| 6,128,239 A * | 10/2000 | Perner | 365/158 |
| 6,169,686 B1 | 1/2001 | Brug et al. | 365/171 |
| 6,185,143 B1 | 2/2001 | Perner et al. | 365/171 |
| 6,256,247 B1 | 7/2001 | Perner | 365/171 |
| 6,259,644 B1 * | 7/2001 | Tran et al. | 365/158 |
| 6,292,389 B1 | 9/2001 | Chen et al. | 365/171 |
| 6,297,983 B1 | 10/2001 | Bhattacharyya | 365/158 |

* cited by examiner

*Primary Examiner*—Trong Phan

(57) ABSTRACT

A data storage device that includes a resistive cross point array of memory cells, a plurality of word lines, and a plurality of bit lines, and a sense amplifier that utilizes an injection charge amplifier is disclosed. The memory cells are arranged into multiple groups of one or more memory cells. The injection charge amplifier determines whether a sensed memory cell is in a first or second resistive state as compared to a reference cell.

28 Claims, 6 Drawing Sheets

RESISTIVE CROSS POINT MEMORY ARRAYS HAVING A CHARGE INJECTION DIFFERENTIAL SENSE AMPLIFIER

BACKGROUND OF THE INVENTION

The present invention relates generally to resistive cross point memory cell arrays and, more particularly, the present invention relates to a resistive cross point memory cell array having a differential sense amplifier that utilizes a charge injection mode.

Many different resistive cross point memory cell arrays have been proposed, including resistive cross point memory cell arrays having magnetic random access memory (MRAM) elements, phase change memory elements, polysilicon memory elements, and write-once (e.g., fuse based or anti-fuse based) resistive memory elements.

A typical MRAM storage device, for example, includes an array of memory cells. Word lines may extend along rows of the memory cells, and bit lines may extend along columns of the memory cells. Each memory cell is located at a cross point of a word line and a bit line. Each MRAM memory cells stores a bit of information as an orientation of a magnetization. In particular, the magnetization of each memory cell assumes one of two stable orientations at any given time. These two stable orientations, parallel and anti-parallel, represent logic values of 0 and 1. The magnetization orientation affects the resistance of a memory cell. For example, the resistance of a memory cell may be a first value, R, if the magnetization orientation is parallel, and the resistance of the memory cell may be increased to a second value, R+ΔR, if the magnetization orientation is changed from parallel to anti-parallel.

In general, the logic state of a resistive cross point memory cell may be read by sensing the resistance state of the selected memory cell. Sensing the resistance state of a single memory cell in the array, however, typically is difficult because all of the memory cells in a resistive cross point memory cell array are interconnected by many parallel paths. The resistance that is seen at one cross point equals the resistance of the memory cell at that cross point in parallel with resistances of memory cells in the other word lines and bit lines.

Thus, one hurdle that must be overcome before high density and fast access resistive cross point memories may be developed is the reliable isolation of selected resistive cross point memory cells while data stored on a selected memory cell is being sensed. In general, prior techniques for isolating such memory cells fall into one of three memory cell isolation categories: select transistor isolation techniques; diode isolation techniques; and equipotential isolation techniques.

Known transistor isolation techniques typically involve inserting a select transistor in series with each resistive cross point memory cell. This architecture typically is characterized by fast read access times. Unfortunately, such series transistor architecture typically also is characterized by relatively poor silicon area utilization because the area under the resistive cross point memory cell array typically is reserved for the series transistors and, therefore, is unavailable for support circuits. In addition, this isolation technique also tends to suffer from relatively poor memory cell layout density because area must be allocated in each memory cell for a via that connects the memory cell to the series transistor in the substrate. This isolation technique also generally requires relatively high write currents because an isolated write conductor must be added to the memory cell to provide a write circuit in parallel with a read circuit and the location of the write conductor results in high write currents to generate the required write fields. In general, this approach is limited to a single memory plane because the series transistors must be located in the substrate and there is no practical way to move the series transistors out of the substrate and into the memory cell plane.

Diode isolation techniques typically involve inserting a diode in series with each resistive cross point memory element. This memory cell array architecture may be implemented with thin film diodes that allow multi-level resistive cross point memory arrays to be constructed (see, e.g., U.S. Pat. No. 5,793,697). This architecture has potential for high-speed operation. The difficulty often associated with this architecture involves providing a suitable thin film diode with minimum process feature sizes matching the potential density of the memory cell arrays. In addition, this approach uses one diode per memory element and, at currently practical MRAM features and parameters, for example, each diode would be required to conduct 5 to 15 $kA/cm^2$. Such high current densities generally are impractical for implementing thin film diodes in high-density MRAM arrays.

Equipotential isolation techniques typically involve sensing resistive cross point memory cells without using series diodes or transistors (see, e.g., U.S. Pat. No. 6,259,644). This approach may be implemented by a cross point array of memory elements that is relatively simple to fabricate. This cross point memory cell array architecture typically has a density that is limited only by the minimum feature sizes of the implementing circuit technology and typically requires relatively low write currents. In addition, it is relatively simple to extend this approach to multi-level resistive cross point memory cell arrays to achieve very high-density memories. Equipotential isolation, however, often is difficult to implement in large arrays. Auto-calibration and triple sample read techniques have been used to sense data in large MRAM arrays using equipotential isolation techniques, but these sense processes typically limit the read sense time to a few micro seconds.

SUMMARY OF THE INVENTION

In one aspect, the invention features a data storage device that includes a resistive cross point array of memory cells, a plurality of word lines, and a plurality of bit lines, wherein a group of memory cells are connected to a common word line and each memory cell in the group is connected to a single bit line. A differential sense amplifier is coupled to the memory cell array and includes a first node selectively connected to a reference cell and a second node selectively coupled to a sense cell within the group of memory cells common to a given word line. A first preamplifier is connected to the first node, and a second preamplifier is connected to the second node. A charge injection amplifier is coupled to outputs of the first and second preamplifiers and is operable to determine a resistive state of the sense cell.

The memory cells may be arranged into multiple groups of one or more memory cells. The charge injection amplifier determines whether a sensed memory cell is in a first or second resistive state as compared to a reference cell. The charge injection amplifier may further comprise a comparator circuit that is coupled to an associated read circuit. The comparator circuit preferably is operable to convert an analog differential sense current to a digital output read signal.

In another aspect of the invention, an information storage device has a memory cell array with a plurality of sense cells and reference cells, each sense cell and reference cell having multiple states, a plurality of word lines, a plurality of bit lines and a differential sense amplifier, coupled to the memory cell array. The differential sense amplifier comprises first and second input nodes, the first input node being selectively coupled to a sense bit line connected to a selected sense cell within the array and the second input node selectively coupled to a reference bit line connected to a selected reference cell within the array. A first preamplifier is coupled to the first input node and has an output providing a first current representative of a state of the selected sense cell. A second preamplifier is coupled to the second input node and has an output providing a second current representative of a state of the selected reference cell. A charge injection amplifier is coupled to the output of the first preamplifier and the output of the second preamplifier, and is operable to sense the difference between the first and second currents to determine the state of the selected sense cell.

In still another aspect of the invention, a method is employed for determining the state of a selected sense cell in an information storage device having a memory cell array with a plurality of sense cells and reference cells, each sense cell and reference cell having multiple states, a plurality of word lines, a plurality of bit lines and a sense amplifier coupled to the memory cell array. The method comprises selectively coupling a sense bit line connected to a selected sense cell within the array to a first input node on the sense amplifier, selectively coupling a reference bit line connected to a selected reference cell within the array to a second input node on the sense amplifier, generating a first current representative of the state of the selected sense cell using a first preamplifier coupled to the first input node, generating a second current representative of the state of the selected reference cell using a second preamplifier coupled to the second input node, and sensing the difference between the first current and the second current to determine a state of the selected sense cell.

Other features and advantages of the invention will become apparent from the following description, including the drawings and the claims.

DETAILED DESCRIPTION OF SPECIFIC EMBODIMENTS

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
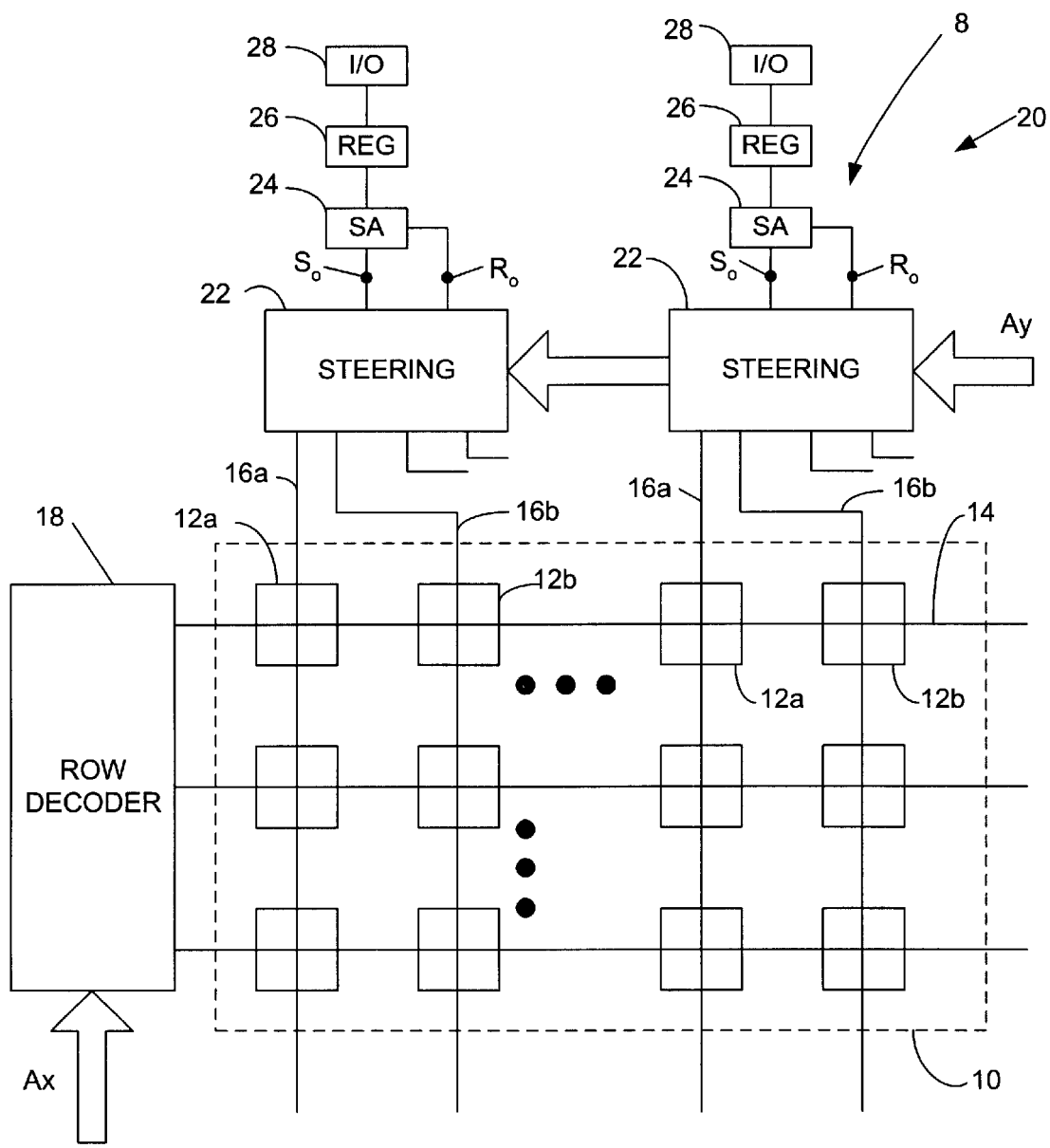
FIG. 1 is a circuit diagram of a data storage device that includes a resistive cross point array of memory cells, multiple read circuits and associated steering circuits, and a word line decode circuit.

Referring to FIG. 1, in one embodiment, a data storage device 8 includes a resistive cross point memory cell array 10, a plurality of word lines 14 that extend along rows of the cross point memory cell array 10, and plurality of bit lines 16a, 16b that extend along columns of the cross point memory cell array 10. The memory cells 12a, 12b of memory cell array 10 may be implemented as any one of a wide variety of conventional resistive memory elements, including magnetic random access memory (MRAM) elements, phase change memory elements, and write-once (e.g., fuse based or anti-fuse based) resistive memory elements.

Data storage device 8 also includes multiple read circuits 20, each of which is coupled to one or more associated sets of memory cells 12a, 12b by a respective bit line 16a, 16b. Each read circuit 20 includes a steering circuit 22 and a sense amplifier 24, and is operable to sense current flow through a memory cell of the associated group (or groups) of memory cells 12a, 12b. The steering circuit 22 selectively couples an associated sense amplifier 24 to a selected bit line 16a, 16b based upon a received bit line address ($A_y$). Each steering circuit 22 also includes a set of switches that connects each bit line pair 16a, 16b to a voltage source of a constant voltage ($V_A$) or to an associated read circuit 20. A word line decode circuit 18 selectively activates a particular word line 14 based upon a received word line address ($A_x$). During read operations, word line decode circuit 18 may activate a selected word line 14 by connecting it to the ground and applying a constant voltage ($V_A$) to other unselected word lines. An output of each read circuit 20 is coupled to an input of a respective input/output (I/O) pad of data storage device 8.

In the illustrated embodiment, resistive cross point memory cell array is shown to have a relatively small number of memory cells 12a, 12b. Other embodiments, however, may include a large number of memory cells. For example, in one embodiment, resistive cross point memory cell array 10 includes a 1024×1024 array of memory cells 12a, 12b and two hundred and fifty-six read circuits 20, each read circuit 20 fitting a pitch of four bit lines 16a, 16b. In this embodiment, a total of four bit lines 16a, 16b may be multiplexed into each read circuit 20. Some embodiments may include multiple levels of memory cell arrays 12a, 12b. In these embodiments, bit lines 16a, 16b from different levels may be multiplexed into the read circuits 20.

In some embodiments, data storage device 8 also may include a write circuit (not shown) for writing information into the memory cells 12a, 12b of resistive cross point memory array 10.

As explained in detail below, the architecture of resistive cross point memory cell array 10 enables high-density fabrication and high-speed operation with isolation diodes that have practical dimensions and current density characteristics. In addition, data storage device 8 includes a novel equipotential isolation circuit that substantially avoids parasitic currents that otherwise might interfere with the sensing of the resistance state of the memory cells 12a, 12b.

Further reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As shown in the drawings for purposes of illustration, the present invention is embodied in a magnetic random access memory device. The MRAM device includes an array of memory cells and a read circuit for reading data from the memory cells. The read circuit, which includes equipotential application devices and differential sensing amplifiers, can reliably sense different resistance states of selected memory cells within the array.

Reference is again made to FIG. 1, which illustrates an information storage device 8 including a resistive cross-point array 10 of memory cell elements 12a and 12b. The memory cell elements 12a and 12b are arranged in rows and columns, with the rows extending along an x-direction and the columns extending along a y-direction. Only a relatively small number of memory cell elements 12a and 12b is shown to simplify the illustration of the information storage device 8. In practice, arrays of any size may be used.

Traces functioning as word lines 14 extend along the x-direction in a plane on one side of the memory cell array 10. Traces functioning as bit lines 16a and 16b extend along the y-direction in a plane on an adjacent side of the memory cell array 10. There may be one word line 14 for each row of the array 10 and one bit line 16a or 16b for each column of the array 10. Each memory cell element 12a, 12b is located at a cross-point of a word line 14 and a bit line 16a or 16b.

The memory cell elements 12a and 12b may include thin film memory elements such as magnetic tunnel junctions (the SDT junction is a type of magnetic tunnel junction), or phase change devices. In general, the memory cells 12a and 12b may include any elements that store or generate information by affecting the magnitude of the nominal resistance of the elements. Such other types of elements include poly-silicon elements as part of read-only memory, and phase change device that could be programmed to change resistance state by changing the state of the material from crystalline to amorphous and vice versa.

Resistance of the SDT junction, for example, is a first value (R) if its magnetization orientation is parallel, and its resistance is increased to a second value (R+ΔR) if its magnetization orientation is changed from parallel to anti-parallel. A typical first resistance value (R) may be about 10 kΩ–1 MΩ and a typical change in resistance (ΔR) may about 30% of the first resistance value (R).

Each memory cell element 12a and 12b retains its orientation of magnetization, even in the absence of external power. Therefore, the memory cell elements 12a and 1 2b are non-volatile.

Data is stored in the memory cell elements 12a and 12b in a bit-bit bar manner. Two memory cell elements 12a and 12b are assigned to each bit of data: one memory cell element (the "data" element) 12a stores the value of the bit, and the other memory cell element (the "reference" element) 12b stores the complement of the value. Thus, if a data element 12a stores a logic '1', its corresponding reference element 12b stores a logic '0'. Each column of data elements 12a is connected to a bit line 16a and each column of reference elements 12b is connected to a bit line 16b.

Figure 2A:
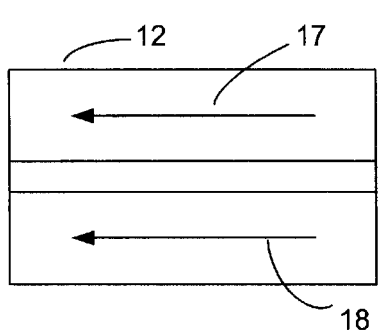
FIGS. 2a and 2b are illustrations of parallel and anti-parallel magnetization orientations of a memory cell.
Figure 2B:
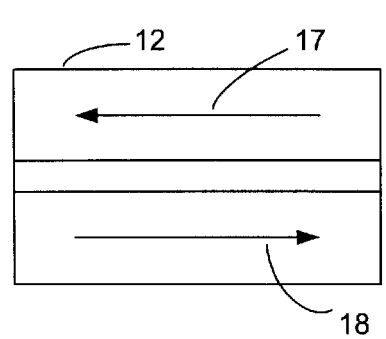

The memory cells 12a, 12b are not limited to any particular type of device. Referring to FIGS. 2A and 2B, spin dependent tunneling (SDT), such as MRAM, devices are well suitable for cross-point memories. A typical SDT MRAM cell 12 includes a "pinned" layer 17 and a "free" layer 18. The pinned layer 17 has a magnetization that is oriented in a plane, but remains fixed in the presence of an applied field in a range of interest. The free layer 18 has a magnetization that can be rotated by the applied field and its orientations are along the "easy-axis" and parallel with the pinned layer 17 magnetization. The magnetization orientation of the free layer 18 is either in parallel, shown in FIG. 2a, or anti-parallel, shown in FIG. 2b, to the magnetization of the pinned layer 17 corresponding to low resistance state and high resistance state respectively.

Returning to FIG. 1, the information storage device 8 includes a row decoder 18 for selecting word lines 14 during read and write operations. A selected word line 14 may be connected to ground during a read operation. A write current may be applied to a selected word line 14 during a write operation.

The information storage device 8 includes a read circuit for sensing the resistance states of selected memory cell elements 12a and 12b during read operations and a write circuit for supplying currents to selected word and bit lines 14, 16a and 16b during write operations. The read circuit is indicated generally at 20. The write circuit is not shown in order to simplify the illustration of the information storage device 8.

The read circuit 20 includes a plurality of steering circuits 22 and sense amplifiers 24. Multiple bit lines 16a, 16b are connected to each steering circuit 22. Each steering circuit 22 includes a decoder for selecting bit lines. A selected memory cell pair 12a, 12b lies at the intersection of a selected word line 14 and a selected bit line 16a, 16b.

Figure 5:
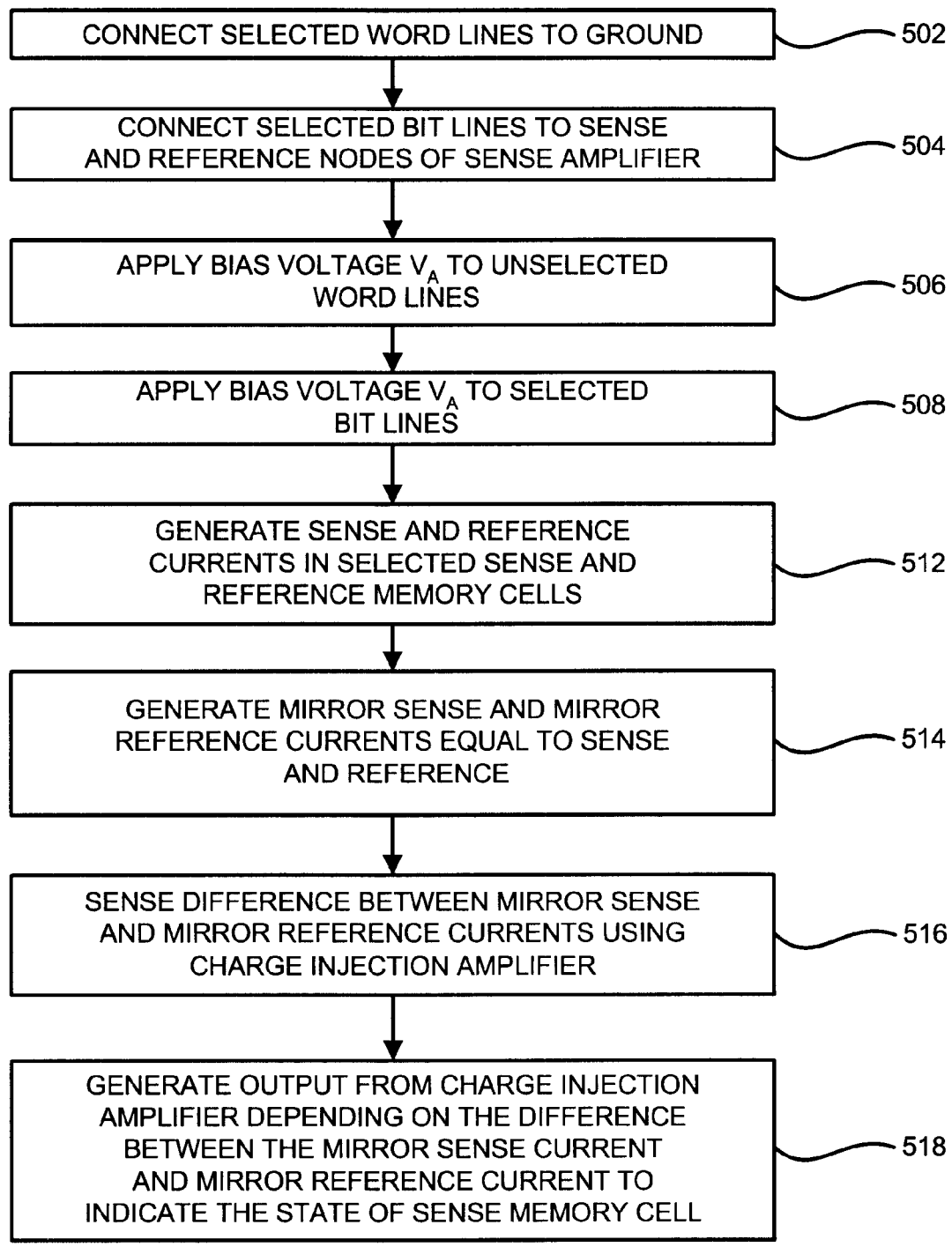
FIG. 5 is a flow diagram of a method of reading a memory cell of the resistive cross point memory cell array of FIG. 1.

During a read operation, which is also depicted in the flow diagram of FIG. 5, the selected elements 12a and 12b are connected to ground by the selected word line 14a, as shown in block 502. Each steering circuit 22 selects a bit line 16a crossing a column of data elements 12a and a bit line 16b crossing the corresponding column of reference elements 12b. The selected bit lines 16a crossing the columns of data elements 12a are connected to sense nodes $S_0$ of their corresponding sense amplifiers 24, as shown in block 504. The steps of block 502 and 504 can be reversed and their order of implementation is not significant. The selected bit lines 16b crossing the columns of reference elements 12b are connected to reference nodes $R_0$ of their corresponding sense amplifiers 24. Each sense amplifier 24, shown in FIGS. 3a–3c, includes differential preamplifiers 36 and 38 having current mirror circuits, a charge injection amplifier 30 and a comparator 34 for comparing signals on the bit lines 16a and 16b. The comparison indicates the resistance state of the selected data element 12a and, therefore, the logic value stored in the selected data element 12a. An output of the sense amplifier 24 is supplied to a data register 26, which, in turn, is coupled to an I/O pad 28 of the information storage device 8.

All unselected word lines 14, are connected to a constant voltage source, which provides an array voltage ($V_A$) as shown in block 506. An external circuit may provide the constant voltage source. As indicated in block 508, the sense amplifiers 24 apply the same potential $V_A$ to the selected bit lines 16a, 16b as the constant voltage source applies to the subset of unselected word-lines. Applying such equipotential isolation to the array 10 reduces parasitic currents.

The read circuit 20 may read out data in m-bit words, whereby the resistance states of a number (m) of memory cell elements 12a and 12b are sensed simultaneously, as described in blocks or steps 512–518 below. An m-bit word might be read out by operating m consecutive sense amplifiers 24 simultaneously.

Figure 3A:
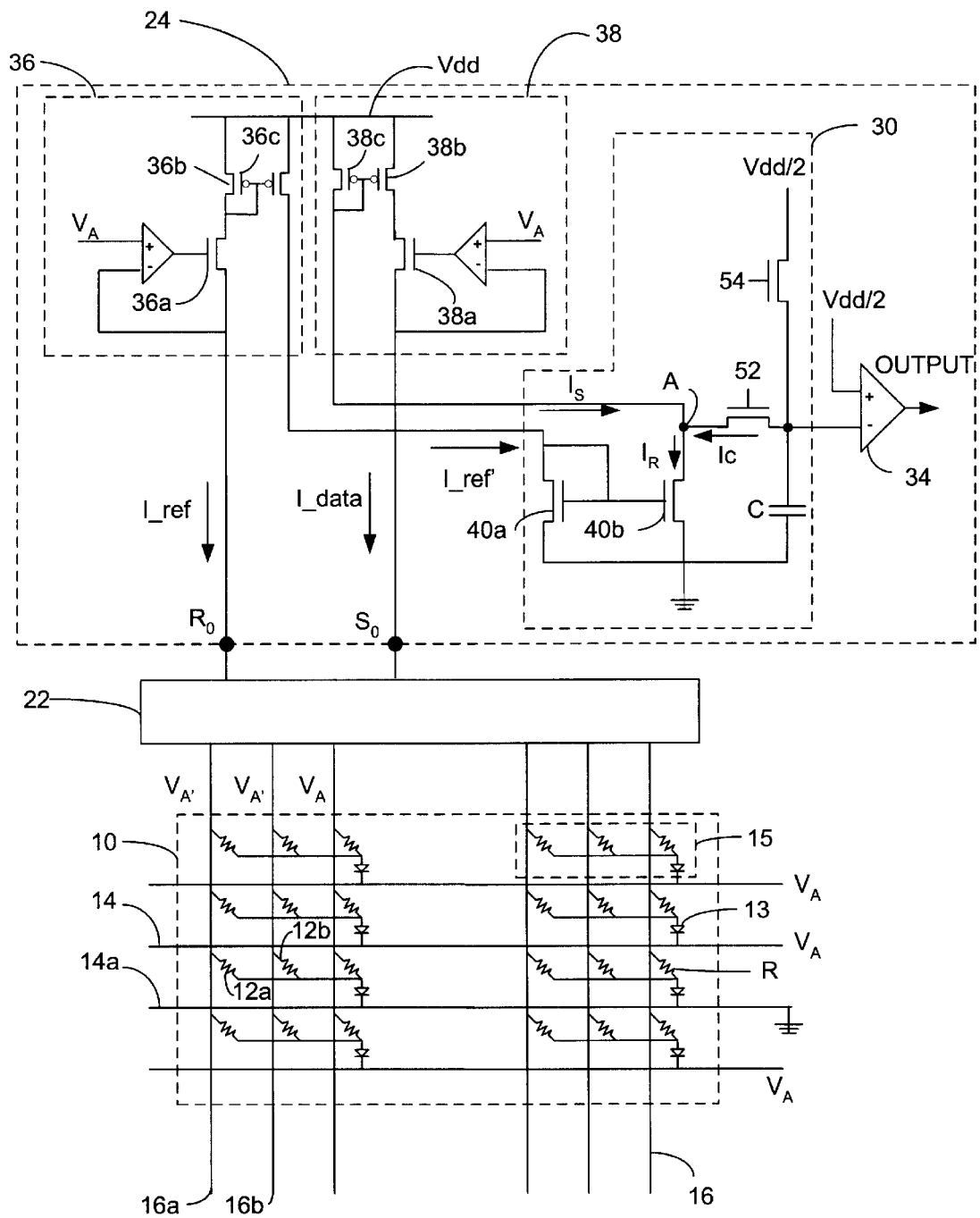
FIG. 3a is a circuit diagram of a sense amplifier circuit that is operable to sense current flow through a memory cell within an array comprised of a group resistive memory elements and a common shared diode using a differential sensing circuit and a comparator in accordance with the present invention.

Referring to FIG. 3a, in one embodiment, the memory cells 12a, 12b of resistive cross point memory cell array 10 are arranged into multiple groups 15 of two or more memory cells 12a, 12b. For example, in the illustrated embodiment, each group 15 includes three memory cells 12a, 12b. The memory cells 12a, 12b of each group 15 are connected between respective bit lines 16a, 16b and a common group isolation diode 13, which is coupled to a word line 14. Resistive cross point memory cell array 10 features the high-speed operational advantages associated with diode isolation architectures and the high-density advantages of equipotential isolation architectures in an architecture that may be implemented with isolation diodes that have practical dimensions and current density characteristics. In some embodiments, isolation diodes 13 may be fabricated with memory cells 12a, 12b using a conventional thin film diode fabrication technology, thereby allowing multi-level resistive cross point memory arrays to be constructed.

For a read operation, data is sensed in a target cell of resistive cross point memory cell array 10 by selecting a word line 14 corresponding to the target memory cell, and connecting it to a ground potential. At the same time, bit lines 16a and 16b are connected to read circuits 20 in reference/sense pairs. An array potential ($V_A$) is applied to the unselected bit lines 16a, 16b of the selected group from the output of a voltage source. Also, the array potential ($V_A$) is applied to the inputs of the sense amplifier 24, resulting in a coupling voltage ($V_{A'}$) on the selected bit lines 16a and 16b. The coupling voltage ($V_{A'}$) substantially equals to the array voltage ($V_A$). The bit lines of unselected groups are left floating. Under the above bias condition of the array, only bit cells of selected group 15 are forward biased with potential voltage $V_A$ and reference current I_ref and sense current I_data are flowing through memory cells 12a and 12b as a result. They are to be sensed by the amplifier 24 to determine the state of the bit cell. Also current is flowing in the bit cells of the selected group but does not interfere with the reference and sense currents.

Figure 3B:
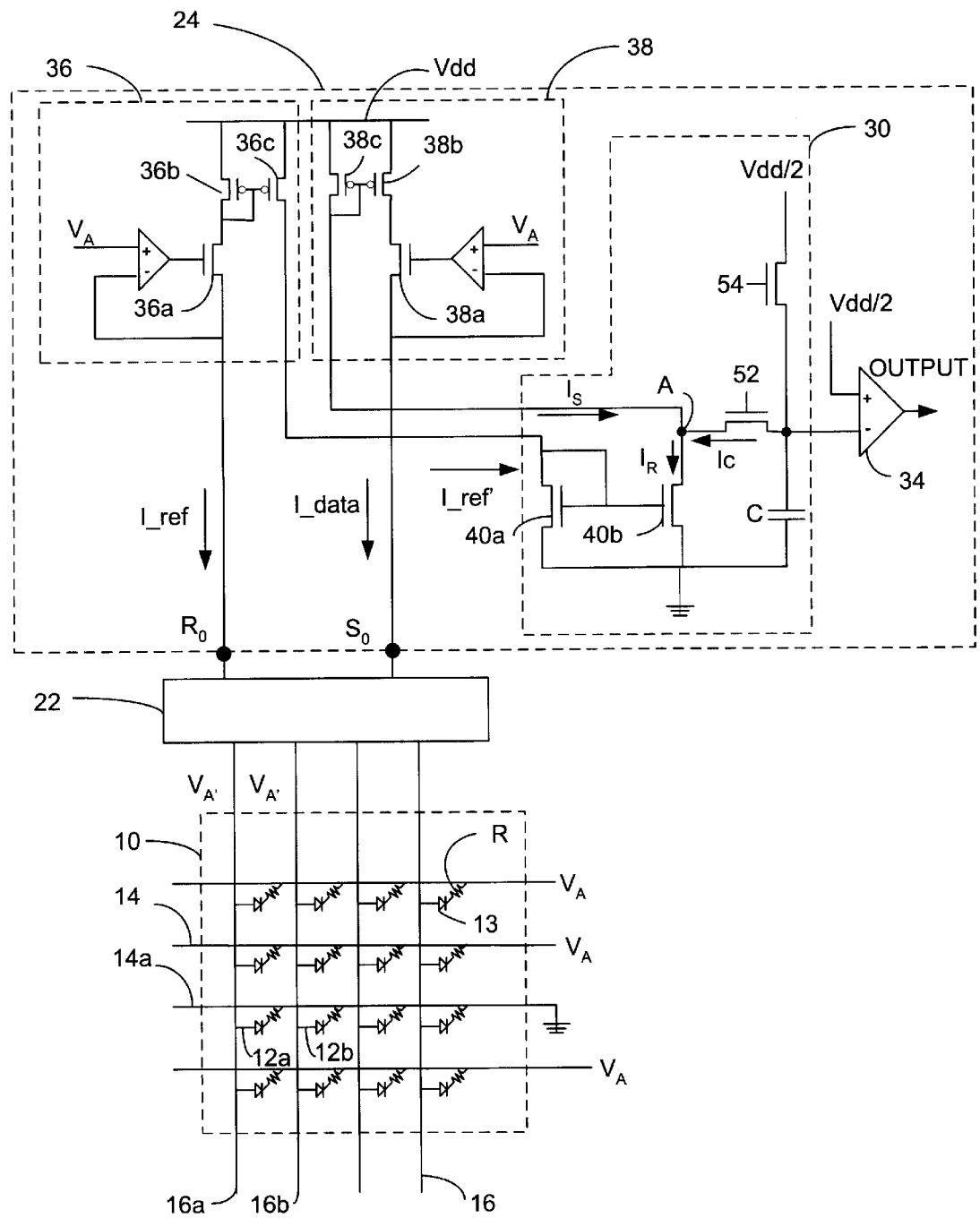
FIG. 3b is a circuit diagram of a sense amplifier circuit that is operable to sense current flow through a memory cell within a resistive/diode memory array using a differential sensing circuit and a comparator in accordance with the present invention.

FIG. 3b depicts an alternative embodiment where the memory, cells 12a, 12b are each coupled directly to a separate isolation diode 13 as shown. The operation of array 10 through amplifier 24 is similar to that illustrated in FIG. 3a and described below.

A read operation is performed on the memory array 10 by connecting the selected word line 14 to the ground potential and connecting all unselected word lines to a potential ($V_A$) to minimize the effect of leakage currents on the sense and reference currents. The selected bit lines 16a and 16b are connected to the inputs of sense amplifier 24 through the multiplexer 22 and nodes $R_0$ and $S_0$. Other inputs of the sense amplifier are connected to the same potential ($V_A$) as the unselected word lines. Thus the selected bit lines 16a and 16b are biased to a potential ($V_{A'}$) that substantially equals to ($V_A$) while other unselected bit lines are left floating. Under the bias condition above to the array, only selected memory cells 12a and 12b are forward biased with potential voltage ($V_A$). As a result, the reference current I_ref and the sense current I_data flowing through memory cells 12a and 12b and sensed by the amplifier 24 are used to determine the state of the bit cell.

Figure 3C:
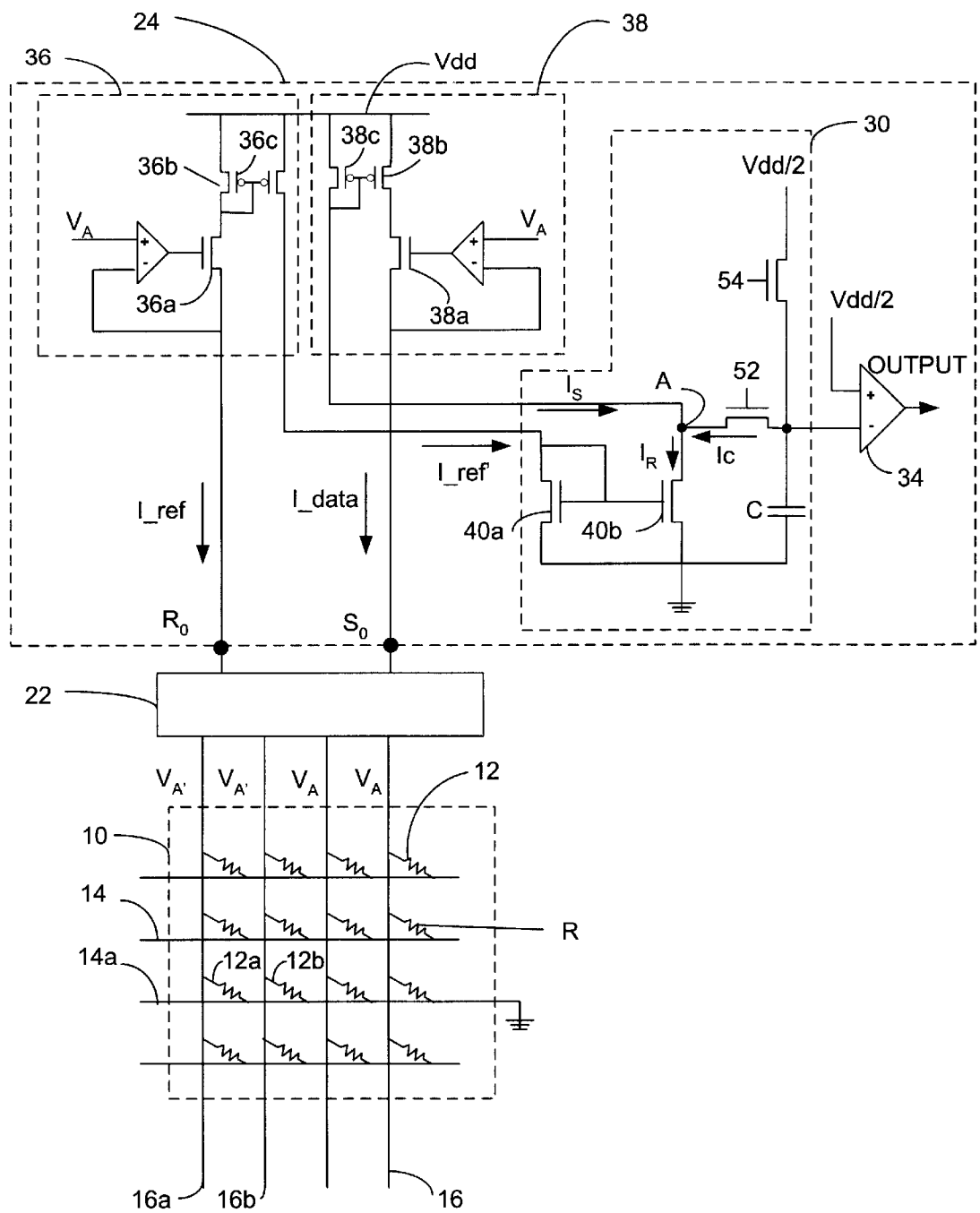
FIG. 3c is a circuit diagram of a sense amplifier circuit that is operable to sense current flow through a memory cell within a resistive memory array using a differential sensing circuit and a comparator in accordance with the present invention.

Further, FIG. 3c depicts a memory cell 12a, 12b without any isolation diode. The operation of array 10 with amplifier 24 is identical to that of FIG. 3a, except for the lack of the isolation diode and the limitations normally imposed on the overall circuit. In the array 10, the magnetic tunnel junction cells 12a, 12b are coupled through many parallel paths that interfere with sensing a bit in the array. This problem may be dealt with by using an "equipotential" method disclosed in U.S. Pat. No. 6,259,644 that involves applying a potential to the selected bit lines 16a and 16b and providing the same potential to a subset of unselected bit lines 16a, 16b and possibly to the unselected word lines 14. The selected word line 14a is connected to the ground potential. Therefore, only memory cells 12a, 12b connected to the selected word line 14a have voltage ($V_A$) across them. Thus, currents are flowing through the cells 12a, 12b on selected word line 14a in a manner so that said currents do not interfere with one another. The reference current I_ref and the sense current I_data can be accurately sensed by the sense amplifier 24 and therefore the state of the stored data bit can be determined.

Reference is now made to the sense amplifier 24 that is common to all three cases illustrated in FIGS. 3a, 3b, and 3c for the steps involved in determining the state of the sensed memory cell. In operation, a data "1" or a data "0" may be sensed by detecting the difference between a current that is generated in the reference bit line and a current that is generated in the sense bit line. In some embodiments, there may be several memory cells associated with a reference bit line. In other embodiments, there may be one reference bit line per bit.

For a read operation, preamplifier 36 has a first input that connects to voltage source ($V_A$) and its output coupled to the gate input of transistor 36a. The source terminal of transistor 36a and the second input of preamplifier 36 are coupled to the selected bit line 16a to which the data bit cell 12a is connected. Similarly, the first input of preamplifier 38 is connected to the voltage source $V_A$ and its output is connected to the gate input of transistor 38a. The source terminal of transistor 38a and the second input of preamplifier 38 are coupled to the selected bit line 16b to which the reference bit cell 12b is connected. The preamplifiers 36 and 38 regulate the voltage on bit lines 16a and 16b to a potential ($V_{A'}$) that substantially equals to voltage ($V_A$). The selected memory elements 12a and 12b thus have a potential ($V_A$) placed across each of them.

In measuring the current in a selected memory cell, step 512 is to generate currents in the selected sense and reference cells 12a and 12b. Specifically, a current I_ref=($V_A$−$V_d$)/R12a flows in selected element 12a and a current I_data=($V_A$−$V_d$)/R12b flows in the selected element 12b as a result of the applied voltages described above. In this embodiment, R12a and R12b are the resistive values of the memory cells 12a, 12b and $V_d$ is the forward diode voltage of diode 13, which is typically approximately 0.7 V. In the embodiment shown in FIG. 3c, there is no diode present in memory array 10, thus $V_d$ is zero in this case.

The I_ref and I_data currents are also flowing through transistors 36a and 38a. Transistors 36b, 36c, 38b, 38c, 40a and 40b are matched transistors and are connected to form three sets of current mirrors. At step 514, mirror transistors 36b and 36c generate mirror current I_ref' that equals I_ref. Mirror transistors 40a and 40b and generate a mirror current $I_R$ that equals I_ref and I_ref'. Similarly, the third set of mirror transistors 38b and 38c generates a current $I_S$ that equals I_data.

As shown in FIGS. 3a–3c, a charge injection amplifier 30, also referred to as a direct charge injection amplifier or an injection charge amplifier, is connected to preamplifiers 36 and 38. Amplifier 30 includes a read enable transistor 52 connected between a node A at the source of mirror transistor 40b and one input to an output comparator 34. A switch transistor 54 is connected between voltage Vdd/2 and the same one input of comparator 34. During a read operation the read enable transistor 52 is turned off and transistor 54 is enabled to pre-charge capacitor C to a voltage level Vdd/2. Subsequently, transistor 54 is turned off and transistor 52 is turned on. At step 516, the charge injection amplifier 30 senses the difference in magnitude of currents $I_S$ and $I_R$. Specifically, at this point, the result of summing the currents at node A is $I_S+I_C-I_R=0$ or $I_C=I_R-I_S$. The capacitor voltage depends on current $I_C$. If current $I_R$ is less than current $I_S$, indicating that the sense cell has a low resistance state and the reference cell has a high resistance state, the current $I_C$ flows away from node A and toward capacitor C and charges capacitor C at a rate of $I_C$. If current $I_R$ is greater than current $I_S$, indicating that the sense cell has a high resistance state and the reference cell has a low resistance state, the current $I_C$ flows toward node A and away from capacitor C and discharges capacitor C at a rate of $I_C$. If both the reference current $I^R$ and the sense current $I_S$ are equal, which means both the reference cell and the sense cell have the same resistive value, then the capacitor current $I_C$ is 0; hence no change will occur in the capacitor voltage.

At step 518, the charge injection amplifier generates an output signal indicating the state of the selected memory cell 12a. Specifically, the capacitor voltage is compared with a reference voltage Vdd/2 by a comparator 34 that provides the output signal OUTPUT for sense amplifier 24. A low level output signal OUTPUT of comparator 34 indicates capacitor C is being charged. Thus, the data bit cell resistance is smaller than reference bit cell resistance. A high level output indicates capacitor C is being discharged. Thus, the data bit cell resistance is larger than reference bit cell resistance.

Figure 4:
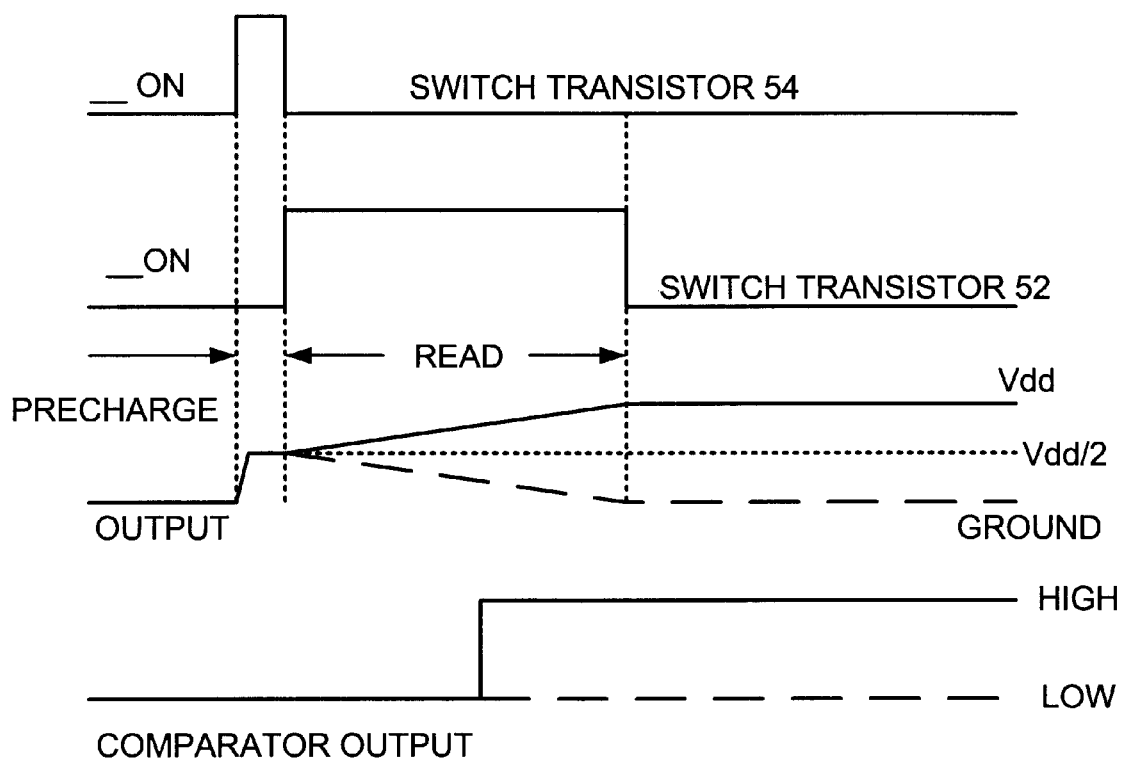
FIG. 4 is timing diagram of a read cycle for circuit FIGS. 3A, 3B, and 3C.

FIG. 4 illustrates the capacitor voltage during a read sequence where the increase in capacitor voltage indicates the $I_S$ sense current is larger then the $I_R$ reference current. Thus, the data bit cell has low resistance and the data bit is a one [1]. A decrease in capacitor voltage indicates the sense current is smaller than the reference current; thus the data element has high resistance and the data bit is a zero [0]. This technique also works well when multiple sense amplifiers are used (i.e., when multiple bit pairs are sensed at the same time).

As shown in FIGS. 3a, b, and c, comparator circuit 34 may be implemented to compare the sense amplifier output signal and a reference signal Vdd/2. This circuit converts an analog differential sense voltage data to reliable full swing digital data output. When combined with the other components of data storage device 10, comparator/latch circuit 34 is a reliable and efficient circuit for completing the sense operation.

The use of a differential charge injection amplifier provides advantages over the prior art. One advantage is that the differential sensing with charge injection amplification provides better common mode noise rejection. This results in a cleaner and more readily discernible output signal. Further, the sense amplifier 24 provides better resolution since the charge injection sense amplifier senses only the differential current ($I_C$) signal so it is more accurate and it has a wider operating range. Additionally, a non-destructive read is possible by using a reference MTJ within the same group where the MTJs are close together and the resistance may be better matched.

Further still, the differential sense amplifier 24 in accordance with the present invention offers a simple design over the prior art by using current mirrors and the charge injection amplifier. This simplifies manufacturing costs and reduces surface area typically associated with prior systems. Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. An information storage device, comprising:
   a resistive cross point memory cell array;
   a plurality of word lines;
   a plurality of bit lines, wherein a group of memory cells are connected to a common word line and each memory cell in the group is connected to a single bit line; and
   a differential sensing amplifier, coupled to the memory cell array, comprising:
   first and second input nodes, the first input node selectively coupled to one of the plurality of bit lines connected to a reference cell within the cell array and the second input node selectively coupled to a sense cell within the group of memory cells common to a given word line;
   a first preamplifier coupled to the first input node;
   a second preamplifier coupled to the second input node; and
   a charge injection amplifier, coupled to an output from the first preamplifier and an output from the second preamplifier, operable to determine a resistive state of the sense cell as compared to a resistive state of the reference cell during a read operation.

2. The invention according to claim 1 wherein the charge injection amplifier determines the resistive state of the sense cell by comparing current flowing through the sense cell with current flowing through one or more reference cells.

3. The invention according to claim 1 further comprising multiple read circuits each coupled to one or more associated groups of memory cells by a respective bit line and operable to sense current flow through a memory cell of the associated groups.

4. The invention according to claim 1 further comprising multiple comparator circuits each coupled to an associated read circuit and operable to convert an analog differential sense voltage to a digital output read signal.

5. The invention according to claim 1 further comprising an equipotential generator coupled to the word lines and the bit lines and operable to set voltage levels in the restive cross point memory cell array on selected word lines and bit lines to substantially prevent parasitic currents from flowing through unselected memory cells.

6. The invention according to claim 5 wherein each cell includes an isolation diode to connect the cell to the bit line, the voltage source is operable to set an input node of the common isolation diode of each group of memory cells with feedback from unselected word lines.

7. The invention according to claim 1 wherein each memory cell comprises a magnetic random access memory element.

8. The invention according to claim 1 wherein the charge injection amplifier comprises:
   a current mirror having a first input coupled to the first preamplifier for receiving a reference current based on the reference current from the reference cell and a second input coupled to the second preamplifier for receiving a sense current based on the sense current from the sense cell;
   a precharge circuit, coupled to the second preamplifier, the precharge circuit being charged to a selected potential prior to a read operation;
   a comparator amplifier, coupled to the precharge circuit and a reference voltage, wherein during a read operation, and as modified by the potential on the precharge circuit, if the sense current from the second preamplifier is greater than the reference current from the first preamplifier the comparator provides a first output or if the reference current is greater than the sense current, the comparator provides a second output as modified by the precharge circuit.

9. An information storage device, comprising:
   a resistive cross point memory cell array;
   a plurality of word lines;
   a plurality of bit lines, wherein the memory cells are arranged into multiple groups of two or more memory cells, each of the memory cells of each group being connected between a respective bit line and a common isolation diode coupled to a common word line; and
   a differential sensing amplifier, coupled to the memory cell array, comprising:
      first and second input nodes, the first input node selectively coupled to one of the plurality of bit lines connected to a reference cell within the cell array and the second input node selectively coupled to a sense cell within the memory array;
      a first preamplifier coupled to the first input node;
      a second preamplifier coupled to the second input node; and
      a charge injection amplifier, coupled to an output from the first preamplifier and an output from the second preamplifier, and being operable to determine a resistive state of the sense cell as compared to a resistive state of the reference cell during a read operation.

10. The invention according to claim 9 wherein the charge injection amplifier determines the resistive state of the sense cell by comparing current flowing through the sense cell with current flowing through one or more reference cells.

11. The invention according to claim 9 further comprising multiple read circuits each coupled to one or more associated groups of memory cells by a respective bit line and operable to sense current flow through a memory cell of the associated groups.

12. The invention according to claim 9 further comprising multiple comparator circuits each coupled to an associated read circuit and operable to convert an analog differential sense voltage to a digital output read signal.

13. The invention according to claim 9 further comprising a voltage source coupled to the word lines and the bit lines and operable to set voltage levels in the restive cross point memory cell array on selected word lines and bit lines to substantially prevent parasitic currents from flowing through unselected memory cells.

14. The invention according to claim 13 wherein the voltage source is operable to set an input node of the common isolation diode of each group of memory cells with feedback from unselected word lines.

15. The invention according to claim 9 wherein each memory cell comprises a magnetic random access memory element.

16. The invention according to claim 9 wherein the charge injection amplifier comprises:
   a current mirror having a first input coupled to the first preamplifier for receiving a reference current based on the reference current from the reference cell and a second input coupled to the second preamplifier for receiving a sense current based on the sense current from the sense cells;
   a precharge circuit, coupled to the second preamplifier, the precharge circuit being charged to a selected potential prior to a read operation;
   a comparator amplifier, coupled to the precharge circuit and a reference voltage, wherein during a read operation, and as modified by the potential on the precharge circuit, when the sense current from the second preamplifier is greater than the reference current from the first preamplifier the comparator provides a first output, when the reference current is greater than the sense current, the comparator provides a second output.

17. A differential amplifier using charge injection for determining a first or second resistive state of a selected circuit based on a comparison of a resistive state of a reference circuit, comprising:
   a first preamplifier coupled to the reference circuit;
   a second preamplifier, coupled to the selected circuit;
   a current mirror having a first input coupled to the first preamplifier for receiving a reference current based on the reference current from the reference circuit and a second input coupled to the second preamplifier for receiving a sense current based on the sense current from the selected circuit;
   a precharge circuit, coupled to the second preamplifier, the precharge circuit being charged to a selected potential prior to a read operation; and
   a comparator amplifier, coupled to the precharge circuit, wherein during a read operation, and as influenced by the potential on the precharge circuit, if the sense current from the second preamplifier is greater than the reference current from the first preamplifier the comparator provides a first output representing the first resistive state or if the reference current is greater than the sense current, the comparator provides a second output representing the second resistive state.

18. The invention according to claim 17 wherein the selected circuit includes a resistive memory sense cell and the reference circuit includes a resistive memory reference cell.

19. An information storage device, having a memory cell array with a plurality of sense cells and reference cells, each sense cell and reference cell having multiple states, a plurality of word lines, a plurality of bit lines and a differential sense amplifier, coupled to the memory cell array, the differential sense amplifier comprising:
   (a) first and second input nodes, the first input node being selectively coupled to a sense bit line connected to a selected sense cell within the array and the second input node being selectively coupled to a reference bit line connected to a selected reference cell within the array;

(b) a first preamplifier coupled to the first input node and having an output providing a first current representative of a state of the selected sense cell;

(c) a second preamplifier coupled to the second input node and having an output providing a second current representative of a state of the selected reference cell; and (d) a charge injection amplifier, coupled to the output of the first preamplifier and the output of the second preamplifier, and being operable to sense the difference between the first and second currents to determine the state of the selected sense cell.

20. The information storage device according to claim 19 wherein the first preamplifier includes a mirror circuit for generating a first mirror current substantially identical to a current flowing through the selected sense cell, and the second preamplifier includes a second mirror circuit for generating a second mirror current substantially identical to a current flowing through the selected reference cell.

21. The information storage device according to claim 20, wherein the charge injection amplifier includes a difference circuit operable for sensing the difference between the first and second mirror currents to determine the state of the selected sense cell.

22. The information storage device according to claim 21, wherein the difference circuit comprises a subtracting circuit for subtracting the first and second mirror currents to generate a difference current, and a capacitor connected to the subtracting circuit for being charged or discharged by the difference current, depending on the magnitude of the difference current.

23. The information storage device according to claim 22, wherein the difference circuit further comprises a comparator having an output representative of whether the capacitor is being charged or discharged.

24. A method for determining a state of a selected sense cell in an information storage device having a memory cell array with a plurality of sense cells and reference cells, each sense cell and reference cell having multiple states, a plurality of word lines, a plurality of bit lines and a sense amplifier coupled to the memory cell array, comprising:

(a) selectively coupling a sense bit line connected to a selected sense cell within the array to a first input node on the sense amplifier;

(b) selectively coupling a reference bit line connected to a selected reference cell within the array to a second input node on the sense amplifier;

(c) generating a first current representative of a state of the selected sense cell using a first preamplifier coupled to the first input node;

(d) generating a second current representative of a state of the selected reference cell using a second preamplifier coupled to the second input node; and (e) sensing the difference between the first current and the second current to determine the state of the selected sense cell.

25. The method according to claim 24 wherein the sensing step comprises determining the difference between the first current and the second current using a charge injection amplifier.

26. A method for determining a state of a selected sense cell in an information storage device having a memory cell array with a plurality of sense cells and reference cells, each sense cell and reference cell having multiple states, a plurality of word lines, a plurality of bit lines and a sense amplifier coupled to the memory cell array, comprising:

(a) generating a sense current in a selected memory cell having a state to be determined;

(b) generating a reference current in a selected reference cell associated with the selected memory cell;

(c) generating a mirror sense current substantially equal to the sense current;

(d) generating a mirror reference current substantially equal to the reference current;

(e) generating a difference current equal to the difference in magnitude between the mirror sense current and the mirror reference current; and (f) generating an output signal representative of the difference current to indicate the state of the selected memory cell.

27. The method according to claim 26, further comprising the step of connecting the difference current to a partially charged capacitor to charge or discharge the capacitor, depending on the magnitude of the difference current.

28. The method according to claim 27, wherein the output signal is representative of whether the capacitor is being charged or discharged.

* * * * *